METHOD OF PRODUCING A PRINTED CIRCUIT BOARD ON A METALLIC SUBSTRATE

INVENTOR.
CLYDE A. NORTON, DECEASED
BY EVA V. NORTON, ADMINISTRATRIX
BY Robert Ames Norton
ATTORNEY FIG. 6 EMBODIMENT #4
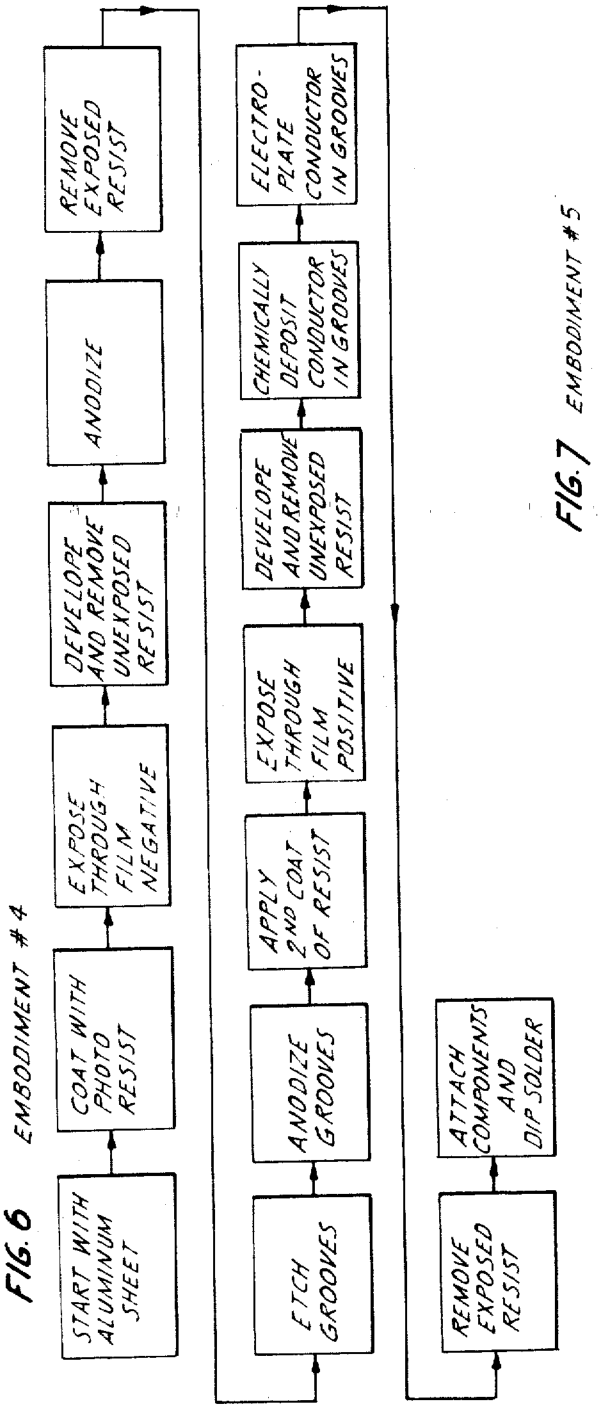
FIG. 7 EMBODIMENT #5
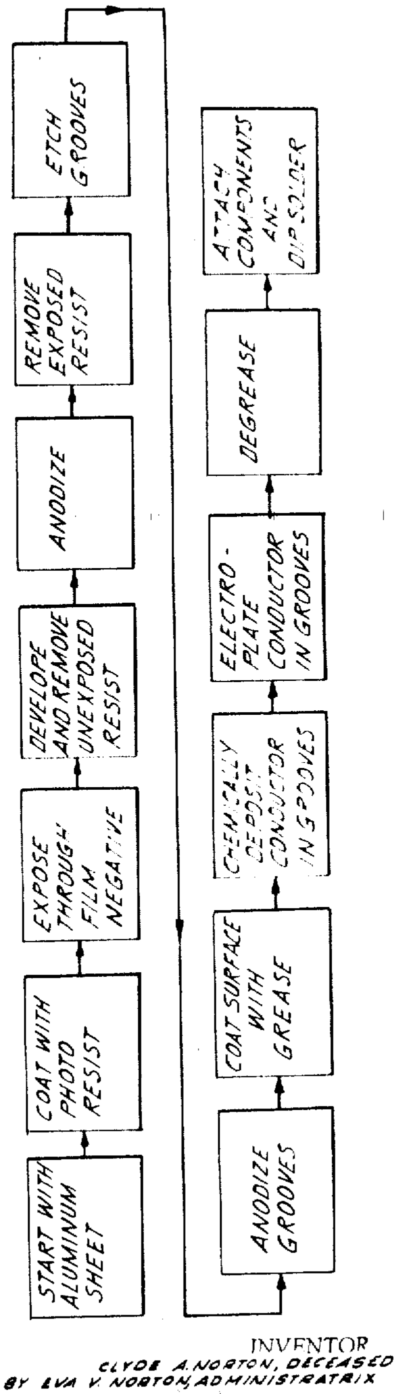
INVENTOR
CLYDE A. NORTON, DECEASED
BY EVA V. NORTON, ADMINISTRATRIX
BY Robert Ames Norton
ATTORNEY FIG. 9. EMBODIMENT #7
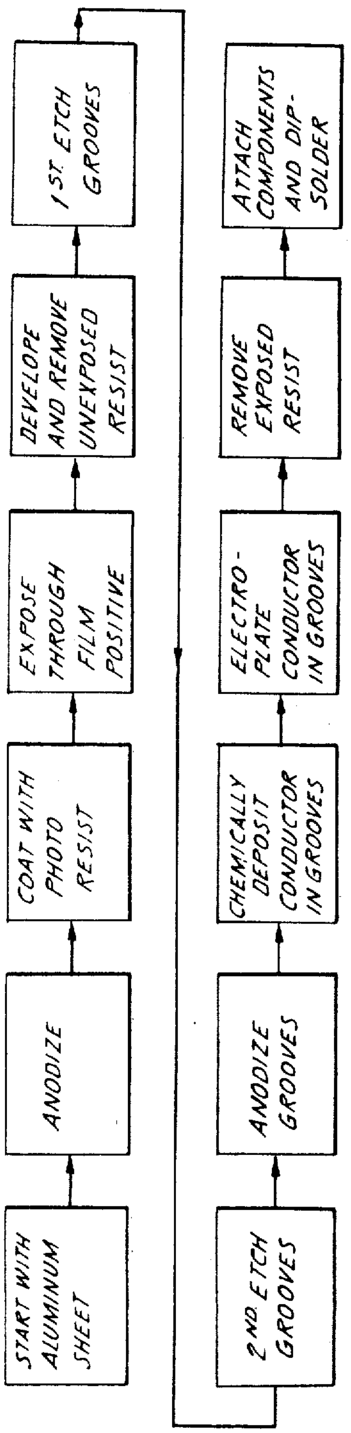
FIG. 8. EMBODIMENT #6
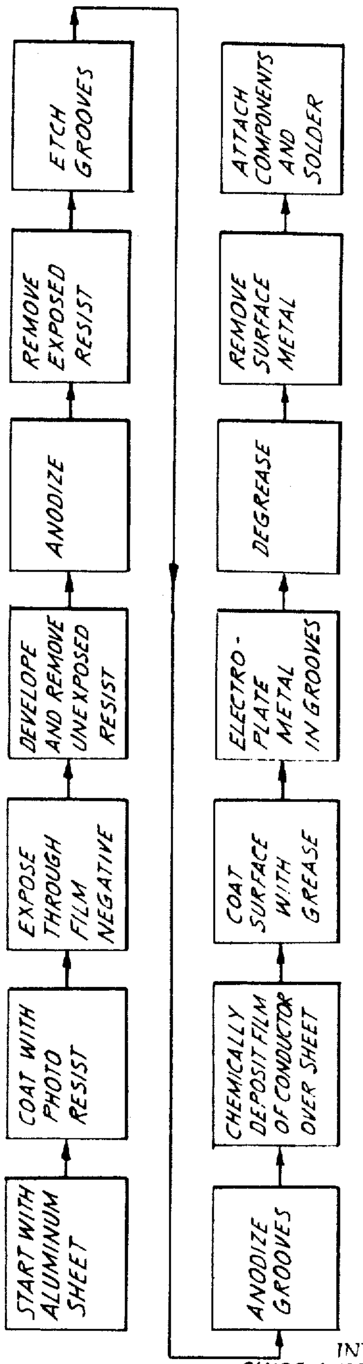
INVENTOR.
CLYDE A. NORTON, DECEASED
BY EVA V. NORTON, ADMINISTRATRIX
BY Robert Ames Norton
ATTORNEY

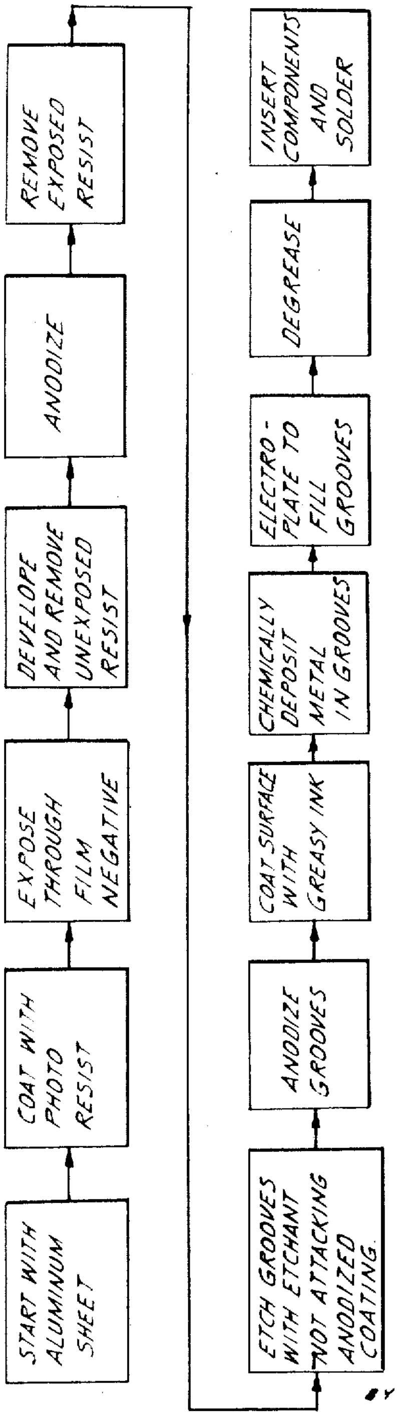
FIG. 10. EMBODIMENT #8
INVENTOR.
CLYDE A. NORTON, DECEASED
BY EVA V. NORTON, ADMINISTRATRIX
BY Robert Elmer Norton
ATTORNEY United States Patent Office 3,424,658

Patented Jan. 28, 1969

3,424,658

METHOD OF PRODUCING A PRINTED CIRCUIT BOARD ON A METALLIC SUBSTRATE

Clyde A. Norton, deceased, late of Greenwich, Conn., by Eva Norton, administratrix, Sachem Lane, Greenwich, Conn. 06830

Original application Ser. No. 387,269, July 28, 1965. Divided and this application Oct. 21, 1965, Ser. No. 500,379

U.S. Cl. 204—15 11 Claims

Int. Cl. C23b 5/48

This invention relates to a process of making what are commonly called "printed circuit boards," and is a division of my co-pending application 387,269, filed July 28, 1965, and now abandoned.

In the preparation of printed circuit boards as generally carried out, the manufacturer customarily starts with what is termed in the trade a "laminate," usually consisting of a sheet of insulating material, sometimes "XXXP," epoxy glass, or other insulator, of the order of 3/32" thickness, which is coated on one or both surfaces with a layer of metal foil, usually copper, which may be of the order of 0.002" thick. The foil is secured to the insulator by a suitable cement or adhesive, which is supposed to give a firm bond between the insulator and the metal foil.

After the circuit to be used on the boards has been determined, the first step has been to make up what is called the "art work," and the result of this is a photograph on film or glass of the circuit to be formed, which may be either negative or positive. These terms are used with their usual photographic meaning. If the photograph is a negative, the final circuit, as it is to be formed, will have the lines representing the conducting pattern transparent, and the insulating spaces opaque. If the photograph is a positive, the reverse will be true.

Ordinarily the next step is to coat the side or sides of the laminate on which the circuit is to be made with a light-sensitive resist. Various suitable resists are well known in the art.

After the resist has dried, the negative film photograph is applied to the resist-coated laminate and exposed to light. The action of the light renders the resist soluble, and after development, the resist may be washed off where it has not been exposed, leaving the resist in place where it has been exposed, in this case covering the foil in the conductor pattern. The board is then dipped into an etching solution appropriate to the metal employed, which etchant will usually be ferric chloride when the foil is copper. In the example given, the board is left in the etching solution for a sufficient length of time for the uncovered foil to be etched completely away, leaving only the foil which is to form the conductors on the completed board, which is in turn covered by the hardened resist. This resist may now be dissolved by a suitable solvent and the board is now complete and ready for the mounting of components which may be transistors, resistors, condensers, inductances, and/or tube sockets, which are usually mounted on the board by pushing their leads through holes drilled or punched in the boards at the appropriate points, and then the entire board is dip-soldered to complete the assembly. The steps described above are all well known and used currently in the manufacture of circuit boards, and do not need further description here. Such circuit boards are used in radio and television, electrical instruments, missile control systems, radio sonde equipment, and many other fields.

In spite of the increasing use of printed circuit boards, they still have a number of drawbacks which have hampered their use under certain conditions. Among the difficulties may be mentioned that of getting a good bond between the foil and the laminate which will not be damaged or destroyed by the soldering process and which will not be subject to peeling or breaking of the conductor lines under extremes of temperature. Another difficulty is warping of the board and absorption of moisture, the former frequently resulting in the breaking of conductor lines and the latter in impairment of the insulation resistance. Still another difficulty with present circuit boards is encountered in their use as a commutator in which a wiping contact travels over the conductors making successive contact with one or another of them. Since the conductors are not flush with the insulating surface, but extend about it by a distance equal to the thickness of the adhesive and the thickness of the metal foil remaining, the edge thus left is subject to rapid wear and even destruction as the wiping contact climbs up from the insulating surface onto the metal surface. Another difficulty which may be mentioned is that of "undercutting." When the board is etched, the etchant does not dissolve the foil in a line perpendicular to the surface, but actually eats its way in sideways, to a greater or less degree. This may result in actual breaking of the conductor in the case of fine and closely spaced conductors.

It is an object of this invention to provide a board which may be fabricated without the use of point-to-point wiring or individual soldering, and in which the step of cementing foil to an insulator is eliminated.

It is a further object of this invention to provide a board which may be easily drilled, which uses rolled sheet metal stock as the board on which the circuit is produced, and in which the conductors forming the circuit are electroplated into grooves etched or otherwise formed into the board, and in which the undercutting occurring during etching actually is a benefit in holding the conductors in place in the grooves of the board.

Still a further object of this invention is to simplify the manufacture of boards and to reduce the cost by employing sheet aluminum or aluminum alloy instead of the comparatively expensive epoxy glass, and which does not suffer from the drawbacks of warpage common in XXXP boards, and which is particularly adaptable to dip soldering, and in which the dip soldering has no harmful effects on the boards as at present.

A further object of the invention is to produce a circuit board which will operate under conditions of temperature, pressure, and moisture with a wider range than the present type of boards.

Still other objects and advantages of my invention will be apparent from the specification.

The features of novelty which are believed to be characteristic of my invention are set forth with particularity in the appended claims. My invention itself, however, both as to its fundamental principles and as to its particular embodiments, will best be understood by reference to the specification and accompanying drawing, in which:

FIGS. 4 to 10 inclusive are flow diagrams of the steps of various embodiments of the process of my invention.

Figure 1:
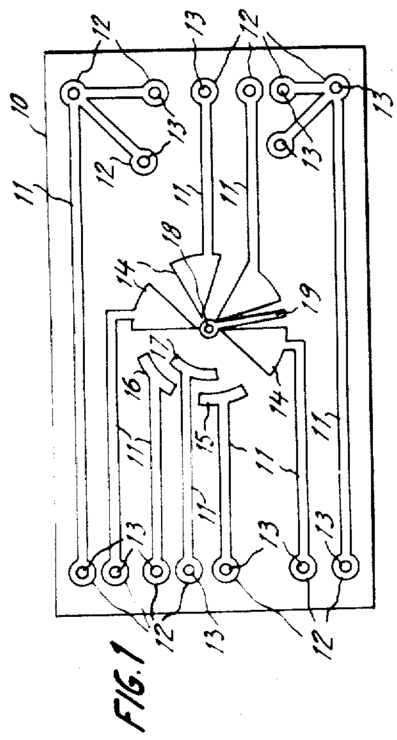
FIG. 1 is a front view of a completed circuit board in accordance with my invention, before the mounting of components on it.

Referring now more particularly to FIG. 1, instead of using the usual plastic laminate, I employ a board 10 of sheet metal, of the order of 3/32" thick, preferably aluminum or an aluminum alloy capable of being anodized. The conductors forming the pattern are electroplated in grooves 9 (FIG. 2) etched in the board and anodized. The conducting pattern may comprise the various conducting leads 11, the terminals 12, in which there is usually a hole 13 drilled through the board to permit the attachment of components, and various commutator segments 14, 15, 16, and 17, adapted to be swept over by a rotating wiper 19 making contact with the face of the board and mounted on a shaft in central hole 18. It will be understood that the particular circuit pattern is shown by way of one example only, and will be varied with the circuit requirements, the designer laying out the pattern which in his judgment best suits the requirements.

EMBODIMENT 1

Figure 2:
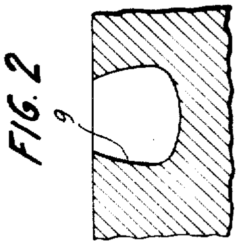
FIG. 2 is a fragmentary enlarged section of the board after etching.
Figure 4:
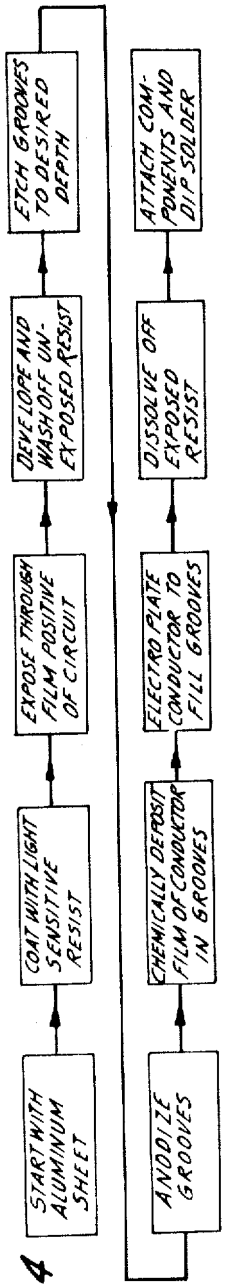
Figure 5:
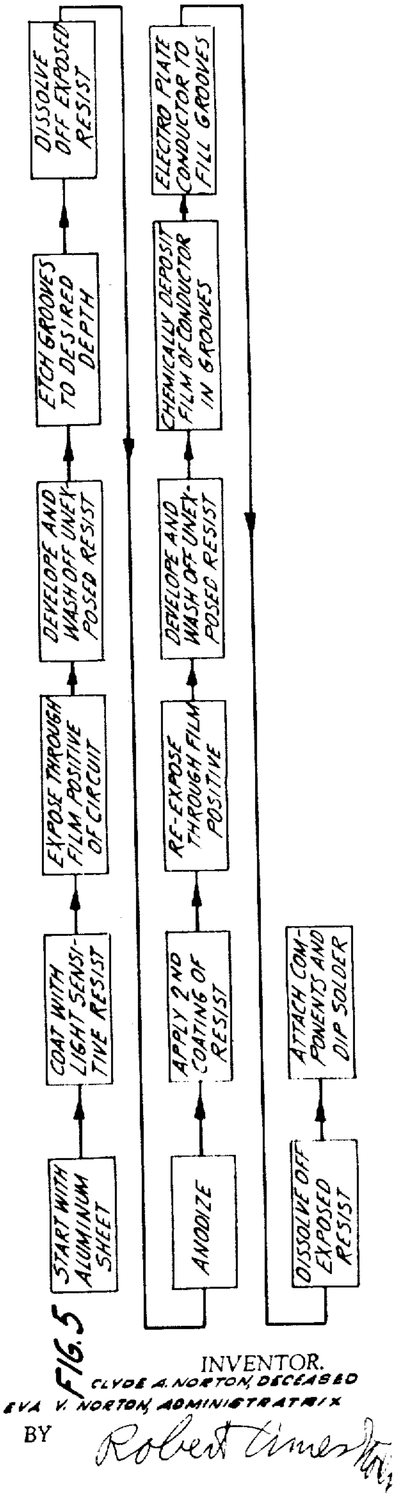

In preparing the circuit board according to one embodiment of this invention, the art work is first prepared, and a positive film or glass plate photograph made from it. As shown in FIG. 4, both sides of the board 10, which is to carry the conducting pattern, are coated with light-sensitive resist, which is allowed to dry, the positive film or plate placed over it, and the exposure made, while care is used to maintain registration by the use of register pins as is common in the art. The exposed board is then developed and the unexposed resist washed off, leaving the aluminum surface exposed where the conductors are to be, and what are to be the insulating spaces covered by the exposed resist. The board is then placed in a suitable etching solution and the etching allowed to proceed until the grooves made by etching have reached the desired depth, which may, for example, be of the order of 0.0005 to 0.002 or 0.003 inch, as shown in FIG. 2. The board is then made the anode in an anodizing bath, and an anodized layer 20 is built up wherever the metal is bare. The anodized coating insulates the conductors to be deposited in the grooves from the body of the board 10, and provides a roughened surface to which the copper or silver of the conductor adheres. No anodized layer is built up on the resist or under it.

Figure 3:
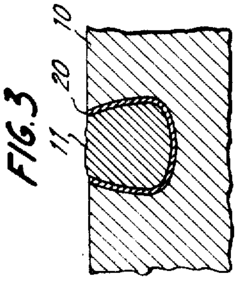
FIG. 3 is a similar view after the conductors have been electroplated into the grooves.

After the anodizing is complete, a flash coating of copper or silver is applied chemically by dipping the board in an "electroless" copper or silver solution which deposits a film of copper or silver over the entire anodized surfaces within the grooves. The board is then made the cathode in a copper or silver plating solution, care being taken to see that good electrical contact is made to each conductor line, for instance, at all terminals 12, and copper or silver is electroplated to fill the etched grooves, if desired, as shown in FIG. 3. It will be noted here that the undercutting is actually an advantage, in that it prevents the deposited conductor from being displaced out of the grooves, since the grooves below the surface are wider than they are at the surface, and the conductor is held in place mechanically. When the board is to be used under conditions which may lead to corrosion, or for other reasons, I may apply a final electroplating of gold or other non-corrosive or corrosion-resistant metal on top of the copper or silver.

The exposed resist may then be removed by dipping in a solvent, and the board is ready for the insertion of components, which is usually done by an automatic machine which inserts the component leads through the proper holes, and the board may then be dip soldered. Since the solder will not adhere to the aluminum, no problem of shorting the conductors will be encountered.

EMBODIMENT 2

Alternatively, instead of anodizing while the resist is still applied, after etching the grooves, the resist may be dissolved off and the entire surface of the board anodized. If this is done, it is desirable to apply a second coating of resist, re-expose through the film positive used before, and wash off the unexposed resist, before applying the flash conductor coating, since it is not desired to plate on what are to be the insulating surfaces of the board. This process is shown in flow diagram FIG. 5.

EMBODIMENT 3

Still another modification may be employed. I may anodize the entire surface of the board after the electroplating has been completed, and in the latter case this may be done without damage to the copper already plated down. Or if it is desired, a resist may be applied on top of the copper plating. While I prefer to use a light-sensitive resist and expose through a film photograph of the circuit pattern, a non-light-sensitive resist may be used, applied through what is referred to as a "silk screen" process, although the screen will usually be made of stainless steel wire. The holes in the board may be drilled or punched at any convenient stage in the fabrication process.

In addition to insulating by anodizing, the grooves in the plate, or the entire plate, may be coated with a layer of insulating lacquer or resin, such as epoxy or "Mylar," and if the board is made of copper or brass, which cannot be anodized, reliance must be placed on this insulating coating. This step may be employed in all the embodiments described herein.

EMBODIMENT 4

Still another modification of the process may be employed if desired. A flow chart of this is shown in FIG. 6. In this instance, I may start with an aluminum or aluminum alloy board as before, apply a coating of photoresist, and after the resist is dried, expose through a film negative of the circuit desired. After development, the resist will be hardened over the metal where the conductors are to be, and the unexposed resist may be dissolved or washed off from all other areas of the board.

The board may then be anodized to build up the aluminum oxide coating over the surface of the board except where the conductors are to be formed, i.e., where the resist was exposed.

The exposed resist may then be removed and the grooves etched by the use of a suitable etching agent. In etching, according to this modification, the etchant to be used should be one which does not attack the anodized coating. It is known that strongly alkaline solutions, such as sodium hydroxide and sodium carbonate, for example, will attack and may dissolve the anodized coating. It is preferable to use ferric chloride ($FeCl_3$), which does not attack the oxide coating.

The anodized coating, and particularly that known as "Martin Hardcoat," actually penetrates the metal of the board. Usually for thin films of the order of 0.002"–0.004", about half the coating is penetration and the other half is overlay.

When the grooves are etched to the desired depth, the board is then removed, washed, and put in the anodizing bath to anodize the surface of the aluminum within the grooves. After this has been completed, I may then proceed as before, by recoating with resist, exposing through a film positive, developing, and removing unexposed resist. In this case the resist over where the conductors are to be will be washed off, since it was unexposed, and a thin (flash) coating of metallic conductor such as copper or silver is then chemically deposited in the grooves, after which a further layer of copper may be deposited electrolytically in the grooves to build up the conductor to the desired thickness, preferably flush with the surface of the board. Gold or other corrosion-resistant metal may be electroplated onto the top surface of the copper if high corrosion-resistance is desired. The exposed resist is then removed.

EMBODIMENT 5

Alternatively, instead of recoating with resist and reexposing after the grooves are etched, and before depositing metal in the grooves, the surface of the board may be coated with a substance which will prevent the metal to be plated from adhering to the surface of the board. This alternative process is shown in the flow chart, FIG. 7. A very thin layer of grease may be applied by a hard roller, but care should be taken that the substance is not squeezed into the grooves. A coating of greasy ink may be applied in this manner, which has the added advantage of making the grooved pattern more easily visible. Then, as before, I may deposit chemically in the grooves a thin film of conductor, such as copper or silver, followed by electroplating, as in the previous example, to fill the grooves.

The exposed resist is then removed and the board is ready for the insertion of components and soldering.

EMBODIMENT 6

Another modification which may be employed, shown in flow chart FIG. 8 is as follows: Proceeding as in the immediately preceding example, I may coat the board with resist, expose through a film negative, develop, and wash off the unexposed resist, leaving the exposed resist covering the areas where the conductors are to be, and then anodize.

The exposed resist is then stripped, and the grooves etched, and the board re-anodized to provide the insulating coating within the grooves. At this point a flash (thin) coating of copper may be deposited chemically over the entire surface of the board. The board may then be coated with a thin coat of grease, such as greasy ink as in the example of FIG. 7. Copper may then be electroplated in the grooves to the desired depth, followed by gold if desired. The board is then degreased.

It is then necessary to remove the flash coat of copper from what are to be the insulating areas of the board. This may be done by a light etching, which removes the thin coat of copper from the insulating areas without removing any substantial amount of metal from the conductors, or the board may be ground slightly to remove the copper from the insulating areas without taking off any significant amount of the anodized coating. It will be understood that after etching, in all the examples, the board will be well washed to remove all the etchant. After being dried, the board is ready for inserting components and soldering.

EMBODIMENT 7

According to another modification, as shown in flow chart FIG. 9, I may start with an aluminum or alloy board and first anodize the entire board, producing a coating of 2 to 4 mils thickness. After washing and drying, I then apply a coating of photo-resist, expose through a film positive, develop the board, and remove the unexposed resist (where the conductors are to be), and then etch to form the grooves for the conductors.

The anodized surface not protected by exposed resist may be etched in a 10% solution of sodium hydroxide at room temperature. This solution will etch at the rate of .001" in about 30 seconds. This etching is continued until the anodized layer has been completely removed. For continued deep etching, the board may be transferred to diluted hydrochloric acid or a mixture of ferric chloride and hydrochloric acid until the grooves have the depth desired, then re-anodized to coat the interior of the grooves. Then a flash coat of conductor may be chemically deposited in the grooves, and then electroplated to build up the conductors to the desired level, followed by an electroplating of nickel, and followed in turn by electroplating hard chromium if desired, if moving contacts are to be used in the application of the board. The chromium coating provides good resistance to wear. If wear is not expected, the copper may be electroplated with gold for corrosion resistance.

The exposed resist is then removed, the board washed and dried, and the components mounted and soldered.

EMBODIMENT 8

Another embodiment of the process, which is for some purposes my preferred embodiment, is as follows:

Starting with an aluminum or aluminum alloy plate capable of being anodized, I apply a coating of photoresist and expose through a film negative. The resist is then developed and the unexposed resist removed, and the plate is then anodized. Since the exposure is made through a negative, where the conductors are to be is still covered by the exposed resist, but the rest of the plate is bare, and is anodized on the bare surface.

The exposed resist is then stripped, and the grooves etched by an etchant which does not attack the anodized coating. As previously stated, this may be ferric chloride ($FeCl_3$). Since the ferric chloride does not attack the anodized layer, and since the anodized layer extends into the plate as well as being built up on the surface (see p. 9, supra), the etching action will occur without undercutting until the grooves have a depth equal to the penetrated layer of aluminum oxide ($Al_2O_3$). Continued etching beyond this depth will result in undercutting and the etching is continued until the grooves have the depth and the amount of undercut desired, after which the board may be again anodized to anodize the interior of the grooves. At this point the flash coating of metal, such as copper or silver, may be deposited within the grooves and the grooves electroplated with metal to fill them flush with the surface.

To assure no deposition of metal on what are to be the insulating surfaces of the plate, the surface may be coated with a greasy ink as previously described for other embodiments. After completion of the electroplating, which may be in its final stages gold or chromium as previously described, the greasy ink is removed and the board is ready for the insertion of components and soldering.

To aid in securing good adherence of the "electroless" copper deposit in the grooves, which may be anodized or insulated by a coating of epoxy or "Mylar," the board may be dipped in a solution of "accelerator" obtainable from suppliers of the "electroless" copper solution, before being dipped into the "electroless" copper solution. Such "accelerators" make it possible to deposit a good, adherent coating of "electroless" copper, even on a smooth surface of plastic.

While I have referred in the various embodiments described to the insertion of components and soldering, this is not a necessary step, since there may be many instances in which only a printed circuit is desired, without having components attached.

To summarize and to show the various steps which may be employed in the various embodiments of my invention, the following table has been prepared:

| Steps | Embodiment No. | | | | | | | |
|---|---|---|---|---|---|---|---|---|
| | 1 | 2 | 3 | 4 | 5 | 6 | 7 | 8 |
| | Figure No. | | | | | | | |
| | 4 | 5 | | 6 | 7 | 8 | 9 | 10 |
| Start with aluminum or aluminum alloy plate or board | X | X | X | X | X | X | X | X |
| Anodize entire board | | | | | | | X | |
| Apply photoresist and expose through film positive | X | X | X | | | | X | |
| Apply photoresist and expose through film negative | | | | X | X | X | | X |
| Develop and remove unexposed resist | X | X | X | X | X | X | X | X |
| Anodize board where resist removed | | | | X | X | X | | X |
| Remove exposed resist | | | | X | X | X | | X |
| Etch grooves | X | X | X | X | X | X | X | X |
| Anodize grooves | X | | X | X | X | X | | + |
| Remove exposed resist and anodize entire board | | X | | | | | X | |
| Re-anodize | | | | | | | | |
| Re-coat with resist | | X | | X | | | | |
| Coat surface with greasy resist | | | | | X | | | X |
| Re-expose through film positive | | X | | X | | | | |
| Develop and remove unexposed resist | | X | | X | | | | |
| Chemically deposit metal conductor in grooves | X | X | X | X | X | | X | X |
| Chemically deposit metal over surface of board | | | | | | X | | |
| Coat surface with greasy resist | | | | | | X | | |
| Electroplate metal to fill grooves | X | X | X | X | X | X | X | X |
| Remove exposed resist | X | X | X | X | | | X | |
| Anodize | | | X | | | | | |
| Degrease | | | | | X | X | | X |
| Remove metal from surface of board | | | | | | X | | |
| Insert components and solder (may be omitted) | X | X | X | X | X | X | X | X |

In the foregoing specification I have described the best mode of carrying out my invention and what for certain cases is the preferred form, but it will be understood that modifications and changes may be made without departing from the spirit and scope of my invention, as will be clear to those skilled in the art.

I claim:

1. The method of making a circuit board which consists in selecting an aluminum or aluminum-containing plate capable of being anodized, applying a resist to the face of said plate, exposing said resist through a positive film except where the conductor pattern is to be, removing the unexposed resist, etching the plate in areas unprotected by the resist to provide grooves therein, anodizing said plate, chemically applying a conducting coating to the interior of said grooves, and electroplating a conductor into said grooves to build up the conducting pattern therein.

2. The method of making a circuit board which consists in selecting an aluminum or aluminum-containing plate capable of being anodized, applying a resist to said plate protecting the parts which are to be insulating spaces on the surface of said plate, etching the plate in areas unprotected by said resist to provide grooves therein, anodizing at least the grooves in said plate, and depositing a conductor to substantially fill said grooves.

3. The process claimed in claim 2 including the step of depositing the conductor mainly by electroplating.

4. The process claimed in claim 2 including the steps of depositing the first layer of conductor in said grooves chemically, and depositing an additional layer of conductor by electroplating.

5. The method of making a circuit board which comprises selecting a plate of metal, etching grooves therein in the pattern of conductors to be formed, applying a layer of insulation at least to the interior of said grooves, and chemically depositing a layer of conducting metal within said grooves.

6. The method claimed in claim 5 which includes the additional step of electroplating a second layer of conductor within said grooves.

7. The method of making a circuit board which comprises selecting a plate of aluminum or aluminum alloy capable of being anodized, etching grooves therein in the pattern of conductors to be formed, anodizing said plate, applying to the surface of said plate a substance preventing adherence of metal thereto, and depositing a conducting metal in said grooves.

8. The method of making a circuit board which comprises selecting a plate of aluminum or aluminum alloy capable of being anodized, anodizing said plate, etching grooves therein in the pattern of conductors to be formed, applying a layer of insulation to the interior of said grooves, and depositing a conducting metal in said grooves.

9. The method claimed in claim 8 in which the step of applying a layer of insulation to the interior of said grooves includes anodizing the interior of said grooves.

10. The method of making a circuit board which comprises the steps of etching grooves in a metallic conducting plate in the pattern of conductors to be formed, applying an insulating coating at least to the interior of said grooves, and chemically depositing a metallic conductor in said grooves.

11. The method claimed in claim 10 in which a metallic conductor is electroplated on the first mentioned metallic conductor in said grooves.

References Cited

UNITED STATES PATENTS 2,773,239 12/1956 Parker ------------ 174—68.5
2,785,997 3/1957 Marvin ------------ 174—68.5
3,202,591 8/1965 Curran -------------- 204—15

JOHN H. MACK, *Primary Examiner.*

T. TUFARIELLO, *Assistant Examiner.*

U.S. Cl. X.R.

117—212; 156—8